Oct. 1, 1968 W. B. HARRIS ET AL 3,404,293

THYRISTOR SWITCH UTILIZING SERIES DIODES TO IMPROVE DYNAMIC BREAKDOWN CAPABILITY AND REDUCE TIME TO RESTORE FORWARD BLOCKING

Filed March 25, 1966

INVENTORS W. B. HARRIS
R. P. MASSEY
F. J. ZGEBURA

BY Walter M. Hill

ATTORNEY

United States Patent Office 3,404,293

Patented Oct. 1, 1968

3,404,293

THYRISTOR SWITCH UTILIZING SERIES DIODES TO IMPROVE DYNAMIC BREAKDOWN CAPABILITY AND REDUCE TIME TO RESTORE FORWARD BLOCKING

William B. Harris, Bernardsville, Richard P. Massey, Westfield, and Frank J. Zgebura, Whippany, N.J., assignors to Bell Telephone Laboratories, Incorporated, New York, N.Y., a corporation of New York Filed Mar. 25, 1966, Ser. No. 537,544

12 Claims. (Cl. 307—252)

This invention relates to switch circuits and more particularly to switch circuits employing semiconductor switching devices capable of operating at high speeds in high power circuits.

Semiconductor devices have been used as switches in a variety of different circuits in the prior art. They are particularly useful as radar pulse modulators and high frequency inverter switches. Among the various semiconductor devices commonly used for this purpose are the four layer PNPN triode devices presently known in the art as silicon controlled rectifiers or thyristors. As is well known, these devices are of the three terminal type and have properties somewhat analogous to the gas-filled thyratron and, like the thyratron, remains conductive once it is switched on until a turn-off mechanism is operated. Although the speed with which the thyristor may operate is inherently much greater than that of which the thyratron is capable, some modern applications require that these speeds be considerably increased over those for which even the thyristor is inherently capable. The use of thyristors, particularly in high voltage series strings, has been hampered by two fundamental and interrelated problems. The first of these problems relates to the dynamic breakdown characteristic of these devices, also known as their rate effect or their *dv/dt* effect. The second problem relates to the minority carrier storage effect on the ability of these devices to quickly regain their forward blocking characteristic after forward conduction.

The first problem relating to the dynamic breakdown characteristic arises when an initially de-energized device is subjected to a sufficiently fast rate of change of forward anode to cathode voltage. This gives rise to a displacement current through the space charge or the depletion layer capacitance of the device to falsely trigger the device into conduction. The second problem relating to the minority carrier storage effect arises by reason of a stored charge developed when the device has been in forward conduction. These charges accumulate in the base and emitter regions of the device and must be essentially eliminated before the device can regain its forward blocking characteristic. A typical recovery time for these devices as presently constructed is in the order of from 10 to 20 microseconds. In order to increase the switching speed of these devices, it is necessary that their dynamic breakdown capability be considerably increased and the time required to restore their forward blocking properties be materially reduced.

It is an object of this invention to reduce the time required to restore the forward blocking capability of a thyristor while at the same time substantially improve its dynamic breakdown capability.

The foregoing object is achieved by this invention which comprises a thyristor switch circuit having a conventional series-resonant turn-off circuit connected across it to turn it off during the second half cycle of the ringing current which starts when the switch is closed. The turn-off time is substantially reduced and the rate effect (*dv/dt*) capability of the circuit is vastly improved by connecting one diode between the thyristor cathode and gate terminals and a second diode between the gate and the anode terminals. To realize these improved operating capabilities, it is essential that the reverse recovery time of the first diode be greater than that of the middle junction of the thyristor while the reverse recovery time of the second diode be less than that of the thyristor middle junction. For some rather limited applications it is possible to replace the diode connected between the gate and cathode terminals with a suitable impedance. This invention has made it possible to reduce the turn-off time of the thyristor to one-half or less of its inherent turn-off time and improve the dynamic breakdown or *dv/dt* capability by about two orders of magnitude.

The invention may be better understood by reference to the accompanying drawings, in which:

FIG. 1 is illustrative of a prior art thyristor circuit employing a resonant turn-off circuit;

FIG. 2 discloses a simple embodiment of the features of this invention;

Figure 4:
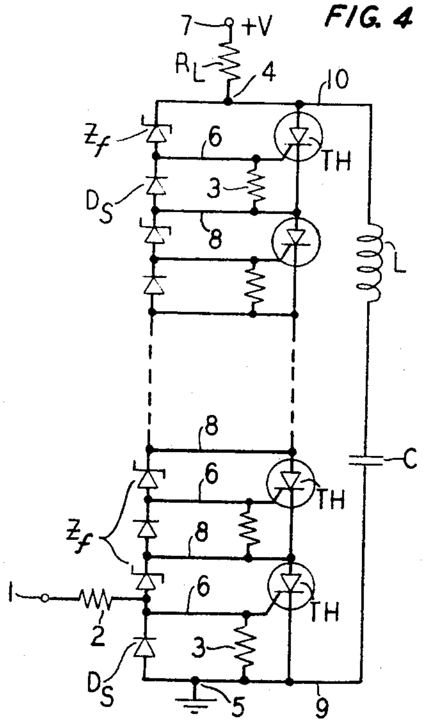
FIG. 4 is an embodiment of the invention in a high voltage series string.
Figure 5:
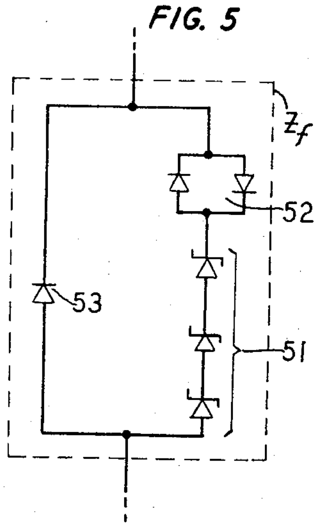

FIG. 5 discloses a circuit employing semiconductor devices capable of simulating a fast recovery Zener diode such as is used in the circuit of FIG. 4.

Figure 1:
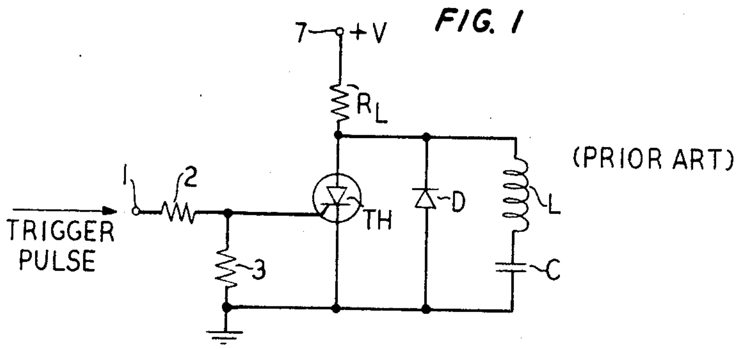

FIG. 1 discloses a conventional thyristor switch circuit of the prior art comprising a thyristor TH having anode, gate and cathode terminals, a resonant turn-off circuit comprising an inductor L and a capacitor C connected in series across the anode and cathode terminals of the thyristor. A diode D is also connected across the anode and cathode terminals of the thyristor. A source of direct voltage V is connected to terminal 7 to which is also connected a load resistor $R_L$, the other end of which is connected to the anode of the thyristor. The cathode is connected to the ground to which the negative terminal of the direct voltage supply is also connected. As is well known, a trigger pulse applied to the input terminal 1 will cause a current to flow through divider resistors 2 and 3, the latter being connected to the gate and cathode terminals of the thyristor so that the voltage pulse developed across resistor 3 will initiate current in the thyristor. Once initiated, the current will continue through a path from the direct voltage source connected to terminal 7, load resistor $R_L$ the anode and cathode path through the thyristor and back to the grounded side of the source. Prior to the initiation of this current through the thyristor, capacitor C of the turn-off circuit is charged to the potential of the direct voltage source V, its upper plate being positive with reference to its lower plate. As soon as the thyristor is rendered conductive, a ringing current starts through inductor L, thyristor TH and capacitor C, the first half cycle of this current flowing in the forward direction through thyristor TH. When the ringing current reverses in phase during its second half cycle, current starts to flow in the reverse direction through thyristor TH until it starts to open at which instant the diode D begins conduction so that the remainder of this half cycle of current flows through the diode D. This automatically turns the thyristor off leaving some residual charge of proper polarity on capacitor C which returns to its initial charge state by current from direct voltage source V through load resistor $R_L$ and inductor L. The circuit now awaits the arrival of another trigger pulse at terminal 1 after which the cycle of operations just described repeats.

It is a known fact that the forward blocking recovery time of thyristors is essentially equal to the recombination time of the center junction in the thyristor and that this period is typically in the order of 10 to 20 microseconds in presently available devices having forward blocking voltage ratings in the range of 400 to 1200 volts. It has been frequently pointed out in published articles that thyristors with shorter forward blocking recovery times may be obtained by constructing devices with lower forward blocking voltage ratings. The dynamic breakdown capability and the forward blocking recovery time are therefore interrelated parameters when recombination is the primary means for middle junction turn-off in the thyristor. It is therefore apparent that, for a given forward blocking voltage rating, a short forward blocking recovery time and a high dynamic breakdown capability are mutually incompatible properties when reliance is placed upon middle junction recombination in the thyristor.

Various methods of increasing the dynamic breakdown capability of thyristors are known in the prior art including a dynamic reverse current bias, the use of shorted emitter structures, the static reverse current bias or resistance bias, the use of shunt capacitors across the anode and cathode or gate and cathode terminals of the thyristor, or the use of a diode in a resistance capacity network across the anode and cathode. While these methods have provided some improvement in the dynamic breakdown capability, the present invention has been found to provide a very much greater improvement in both the breakdown capability as well as the forward blocking recovery time. The manner by which this is achieved will be described in connection with the simple embodiment of the invention in FIG. 2.

Figure 2:
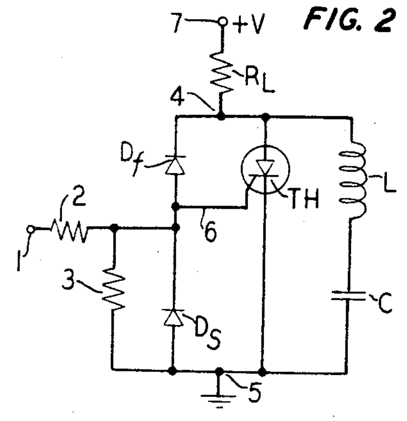
Figure 3:
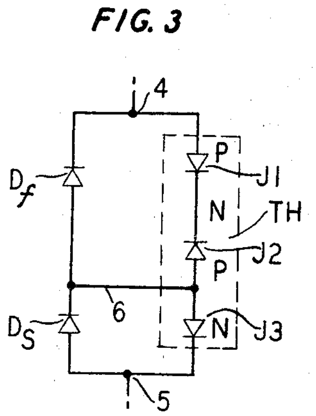
FIG. 3 is a portion of the circuit of FIG. 2 for the purposes of more clearly explaining its operation.

FIG. 2 discloses a simple embodiment of the present invention in which a thyristor TH having its anode connected to terminal 4, its cathode connected to the grounded terminal 5 and a gate electrode connected to lead 6 is shown with a resonant turn-off circuit comprising inductor L and capacitor C connected in series across the thyristor anode and cathode terminals. A load resistor $R_L$ is connected between the power supply terminal 7 and terminal 4 while the gate and cathode terminals are connected to the trigger pulse terminal 1 through resistors 2 and 3 in the same manner described in FIG. 1. So far this circuit is essentially the same as described in FIG 1. Instead of connecting a single diode D across the anode and cathode terminals as in FIG. 1, two diodes $D_s$ and $D_f$ are connected in series across the anode and cathode terminals while the junction between these two diodes is connected to the gate terminal of the thyristor by way of the conductor 6. In order to realize the advantages of this invention it is essential that the reverse recovery time of diode $D_s$ be longer than the reverse recovery time of the middle junction of the thyristor and that the reverse recovery time of diode $D_f$ be less than that of the middle junction of the thyristor. This may be better understood by referring momentarily to FIG. 3 in which the thyristor TH is shown as a four layer PNPN device having the three junctions J1, J2 and J3, respectively. The third layer of P type material existing between junctions J2 and J3 comprises the gate terminal of the thyristor and is connected by way of conductor 6 to the junction between diodes $D_f$ and $D_s$. By a simple comparison of this circuit with that of FIG. 2 it will be noted that they are identical insofar as the circuits interconnecting the solid state devices are concerned. The operation of this circuit will now be described.

First it may be said that the basic objective of this novel circuit arrangement is to both reduce the turn-off time of the center junction of the thyristor and increase its *dv/dt* capability. This is done by not depending upon center junction recombination in the thyristor. Instead, in addition to the normal reverse current flow which turns off the outer junctions J1 and J3, the center junction J2 is turned off with a reverse current while at the same time gate triggering is prevented. It is assumed that the ringing circuit contains negligible resistance. The operation of this circuit up to the point where reverse current begins to flow through the thyristor at the start of the second half cycle of ringing current is the same as previously described for FIG. 1. It should be noted that this reverse ringing current is a reverse current for both junctions J1 and J3 but a forward current for junction J2. Initially, this reverse current flows through the thyristor because diode $D_s$ is momentarily reverse biased by the stored charge in junction J3 and diode $D_f$ is biased below its threshold voltage by the opposed junctions J1 and J2. The reverse ringing current will reduce the existing charge density at junction J3 to zero first, thereby causing this junction to open so that current increases in diode $D_s$ until it is carrying all of the reverse current. The reverse current continues to flow through diode $D_s$ and junctions J1 and J2 until the existing charge in junction J1 is reduced to zero, thereby causing the current flowing through junctions J1 and J2 to decrease toward zero while the current through $D_f$ correspondingly increases to the limit of the reverse current. Since the middle junction J2 was forward biased, the existing charge density in this junction is not zero but it begins to recover by recombination. The thyristor is now open at both junctions J1 and J3 and further reverse current is unnecessary except to store some more charge in diode $D_s$. Since the reverse recovery time of diode $D_f$ is less than the reverse recovery time of the middle junction J2, a forward current will now be reapplied to the device. This is a reverse current for the middle junction and equals the difference between the load current and the ringing network current. Gate triggering is prevented by preventing the sum of the alphas of the equivalent transistors comprising the thyristor from equalling or exceeding unity. This is achieved by designing the diode $D_s$ to recover more slowly than the middle junction J2.

It will, therefore, be seen that it is necessary that the reverse recovery times of the diodes $D_f$ and $D_s$ be properly related to the reverse recovery time of the center junction J2. So long as the reverse recovery of diode $D_f$ is faster than that of junction J2 and the reverse recovery of diode $D_s$ is slower than that of junction J2, the improved performance provided by this invention will be realized. Of course, the degree to which the improvement may be realized is increased as the reverse recovery rates of diodes $D_f$ and $D_s$ are made progressively faster and slower, respectively, with reference to the recovery rate of junction J2.

The embodiment of the invention shown in FIG. 2 may be extended to a high voltage series string of the type shown in FIG. 4. By comparing these two figures, it will be evident that the circuit comprising the thyristor and the two diodes of FIG. 2 forms a single unit or stage in FIG. 4 and that a plurality of these stages are connected in series between terminals 4 and 5. The entire string is turned on by simultaneously firing one or more stages from the trigger pulse at terminal 1, the number to be fired depending upon the length of the string. In FIG. 4 it is assumed that triggering is accomplished by firing only the bottom stage. A simple fast recovery diode such as $D_f$ cannot be successfully used in a series string so it is necessary that this diode be replaced with one of the Zener type having a fast reverse recovery time. These are designated as diodes $Z_f$ in FIG. 4. The voltage V applied to terminal 7 must be less than the sum of the reverse breakdown voltages of the Zener diodes $Z_f$. When one or more of the stages at the grounded end are fired by the trigger pulse, the sum of the reverse breakdown voltages of the remaining Zener diodes becomes less than the supply voltage causing all of the remaining Zener diodes to break down. This mode of operation can be better understood by assuming that the lower stage in FIG. 4 is fired by a trigger pulse applied to terminal 1 in the same manner previously described for FIG. 2. It is assumed that the supply voltage at terminal 7 exceeds the sum of the reverse breakdown voltages of the remaining Zener diodes so that current now flows through the series circuit from terminal 7, resistor $R_L$, the several Zener diodes, their associated resistors 3 and the bottom thyristor TH to ground. The voltage drop across resistors 3 in each stage turns on their associated thyristors thereby rendering the entire string conductive. This begins the ringing cycle of the turn-off circuit LC which causes each stage to turn off by the same process previously described for FIG. 2.

At the present time there is no Zener diode capable of a sufficiently fast reverse recovery time comparable to that of the simple diode $D_f$ of FIG. 2. However, this can be simulated by the diode network shown in FIG. 5. In this figure, a plurality of Zener diodes 51 are connected in series, the number required depending upon the voltage rating per stage. In series with these Zener diodes is a varistor network 52 comprising a pair of parallel connected oppositely opposed diodes. This entire series combination is shunted by a fast recovery diode 53. The function of the varistor network 52 is to provide an additional forward voltage drop in series with those of the Zener diodes 51 so that the fast recovery diode 53 will be certain to conduct all of the current in the forward direction. As previously indicated, this entire network shown in FIG. 5 is equivalent to one of the Zener diodes $Z_f$ of the string shown in FIG. 4.

A variety of modifications of this circuit embodying the principles of the invention will be evident to those skilled in this art. For example, the thyristors may be constructed to embody the "shorted emitter" principle described by Messrs. R. W. Aldrich and N. Holonyak in an article entitled "Two-Terminal Asymmetrical and Symmetrical Silicon Negative Resistance Switches," published in vol. 30, No. 11, of the Journal of Applied Physics for November 1959, pages 1819 through 1824. Where the shorted emitter thyristor is used, the resistor 3 connected between the gate and cathode of each thyristor may be omitted. For some applications where the number of stages are not too great, the slow recovery diodes $D_s$ and the resistors 3 may both be replaced by a generalized impedance. In the simplest form, this impedance may consist of a simple resistor and in other cases reactive elements may be included, depending upon the exact nature of the circuit requirements. For example, a simple resistor may be used if the series string voltage is less than a critical value which would cause the string to either false fire or latch up, the rise and fall times of the switch string are longer than a critical value to cause either false firing or latch up, and both the pulse and the interpulse widths exceed a critical value to cause either false firing or latch up. These critical values must be determined in each case based upon the design parameters of the particular circuit and component devices selected.

What is claimed is:

1. A switch circuit comprising at least one thyristor having four layers forming three junctions between said layers, an anode terminal connected to the first of said layers, a gate terminal connected to the third of said layers and a cathode terminal connected to the fourth of said layers, the middle junction existing between said second and third layers having an inherent reverse recovery time, a series-resonant turn-off circuit connected into a circuit in series with said anode and cathode terminals, a first diode connected between said cathode and gate terminals, a second diode connected between said anode and gate terminals, the inherent reverse recovery time of said middle junction being less than that of said first diode and greater than that of said second diode.

2. The combination of claim 1 wherein a plurality of thyristors are connected in series and each of said second diodes is of the Zener type.

3. The combination of claim 1 and a resistor connected in parallel with said first diode between said cathode and gate terminals.

4. The combination of claim 1 and a load impedance and a source of direct voltage connected in series with said thyristor.

5. A switch circuit comprising at least one thyristor having an anode terminal, a cathode terminal and a gate terminal, three serially-connected junctions in said thyristor, a series-resonant turn-off circuit connected in series with said anode and cathode terminals, a first diode connected between the cathode and gate terminals of said thyristor, a second diode connected between the anode and gate terminals of said thyristor, the centrally located one of said three thyristor junctions and the junctions of said first and second diodes each having inherent reverse recovery times, the inherent reverse recovery time of said centrally located junction being less than that of said first diode and greater than that of said second diode.

6. The combination of claim 5 wherein a plurality of thyristors are connected in series and each of said second diodes is of the Zener type.

7. The combination of claim 5 and a resistor connected in parallel with said first diode between said cathode and gate terminals.

8. The combination of claim 5 and a load impedance and a source of direct voltage connected in series with said anode and cathode terminals.

9. A switch circuit comprising at least one thyristor having an anode terminal, a cathode terminal and a gate terminal, three serially-connected junctions in said thyristor, a series-resonant turn-off circuit connected in series with said anode and cathode terminals, an impedance means connected between the cathode and gate terminals of said thyristor, a diode connected between the anode and gate terminals of said thyristor, the centrally located one of said three thyristor junctions and the junction of said diode each having an inherent reverse recovery time, the inherent reverse recovery time of said centrally located junction being greater than that of said diode.

10. The combination of claim 9 wherein a plurality of thyristors are connected in series and each of said diodes is of the Zener type.

11. The combination of claim 9 wherein said impedance means is a second diode having a reverse recovery time greater than that of said centrally located junction

12. The combination of claim 9 and a load impedance and a source of direct voltage connected in series with said anode and cathode terminals.

No references cited.

ARTHUR GAUSS, *Primary Examiner.*

S. D. MILLER, *Assistant Examiner.*